US011835758B2

(12) United States Patent
Pezeshki et al.

(10) Patent No.: US 11,835,758 B2
(45) Date of Patent: Dec. 5, 2023

(54) PACKAGING FOR MICROLEDS FOR CHIP TO CHIP COMMUNICATION

(71) Applicant: AvicenaTech Corp., Mountain View, CA (US)

(72) Inventors: Bardia Pezeshki, Sunnyvale, CA (US); Robert Kalman, Sunnyvale, CA (US); Alex Tselikov, Sunnyvale, CA (US)

(73) Assignee: AvicenaTech Corp., Mountain View, CA (US)

( * ) Notice: Subject to any disclaimer, the term of this patent is extended or adjusted under 35 U.S.C. 154(b) by 0 days.

(21) Appl. No.: 17/994,784

(22) Filed: Nov. 28, 2022

(65) Prior Publication Data

US 2023/0176281 A1   Jun. 8, 2023

Related U.S. Application Data

(63) Continuation of application No. 17/145,110, filed on Jan. 8, 2021, now Pat. No. 11,513,285.

(60) Provisional application No. 62/960,546, filed on Jan. 13, 2020, provisional application No. 62/958,619, filed on Jan. 8, 2020.

(51) Int. Cl.
*G02B 6/12* (2006.01)
*H01L 25/16* (2023.01)

(52) U.S. Cl.
CPC ........ *G02B 6/12004* (2013.01); *H01L 25/167* (2013.01)

(58) Field of Classification Search
CPC .................. G02B 6/12004; H01L 25/167
See application file for complete search history.

(56) References Cited

U.S. PATENT DOCUMENTS

| 4,672,381 | A | 6/1987 | Labbe |
| 5,335,361 | A | 8/1994 | Ghaem |
| 5,638,469 | A | 6/1997 | Feldman |
| 5,848,214 | A | 12/1998 | Haas |
| 7,459,726 | B2 | 12/2008 | Kato |
| 7,915,699 | B2 | 3/2011 | Krishnamoorthy |
| 8,148,202 | B2 | 4/2012 | Krishnamoorthy |
| 10,437,974 | B2 | 10/2019 | He |
| 2002/0018628 | A1 | 2/2002 | Kim |
| 2004/0020353 | A1 | 2/2004 | Ravid |
| 2004/0159777 | A1 | 8/2004 | Stone |
| 2004/0208416 | A1 | 10/2004 | Chakravorty |
| 2005/0194605 | A1 | 9/2005 | Shelton |
| 2008/0285910 | A1 | 11/2008 | Yamada |
| 2011/0235974 | A1 | 9/2011 | Tay |

(Continued)

FOREIGN PATENT DOCUMENTS

JP   2011014932 A   1/2011

OTHER PUBLICATIONS

J. F. C. Carreira et al., Direct integration of micro-LEDs and a SPAD detector on a silicon CMOS chip for data communications and time-of-flight ranging, Optics Express, vol. 28, No. 5, Mar. 2, 2020, pp. 6909-6917.

(Continued)

*Primary Examiner* — Ellen E Kim
(74) *Attorney, Agent, or Firm* — KOS IP Law LLP

(57) ABSTRACT

A microLED based optical chip-to-chip interconnect may optically couple chips in a variety of ways. The microLEDs may be positioned within a waveguide, and the interconnects may be arranged as direct connections, in bus topologies, or as repeaters.

8 Claims, 16 Drawing Sheets

(56) References Cited

U.S. PATENT DOCUMENTS

| | | | |
|---|---|---|---|
| 2011/0294240 A1* | 12/2011 | Kim | H01L 33/505 257/E33.056 |
| 2012/0086028 A1 | 4/2012 | Beeson | |
| 2013/0111744 A1 | 5/2013 | Tischler | |
| 2013/0230280 A1 | 9/2013 | Kadar-Kallen | |
| 2015/0243648 A1 | 8/2015 | Edwards | |
| 2016/0020353 A1* | 1/2016 | Chu | H01L 24/97 257/21 |
| 2016/0170120 A1 | 6/2016 | Shani | |
| 2016/0172020 A1 | 6/2016 | Baker | |
| 2016/0233269 A1 | 8/2016 | Choi | |
| 2017/0040306 A1 | 2/2017 | Kim | |
| 2017/0276874 A1 | 9/2017 | Kashyap | |
| 2018/0098399 A1 | 4/2018 | Takeshita | |
| 2018/0239096 A1 | 8/2018 | Houbertz | |
| 2018/0269191 A1* | 9/2018 | England | H01L 25/167 |
| 2019/0011652 A1 | 1/2019 | Chang | |
| 2019/0031586 A1 | 1/2019 | Suh | |
| 2019/0049367 A1 | 2/2019 | Zou | |
| 2019/0066571 A1* | 2/2019 | Goward | G09G 3/3233 |
| 2019/0072720 A1 | 3/2019 | Heanue | |
| 2019/0088633 A1 | 3/2019 | Tao | |
| 2019/0146151 A1 | 5/2019 | Meister | |
| 2019/0165209 A1 | 5/2019 | Bonar | |
| 2019/0189603 A1 | 6/2019 | Wang | |

OTHER PUBLICATIONS

Martin D. Dawson, Micro-LEDs for Technological Convergence between Displays, Optical Communications, & Sensing and Imaging Systems, SID Display Week 2020, Session 44, Invited paper No. 44.1, 27 pages.

Lars Brusberg et al., Optoelectronic Glass Substrate for Co-packaged Optics and ASICs, Optical Fiber Communication Conference, Mar. 12, 2020, San Diego, CA, pp. 1-24.

Roger Dangel et al., Polymer Waveguides Enabling Scalable Low-Loss Adiabatic Optical Coupling for Silicon Photonics, IEEE Journal of Selected Topics In Quantum Electronics, vol. 24, No. 4, Jul./Aug. 2018, 11 pages.

Ziyang Zhang et al., Hybrid Photonic Integration on a Polymer Platform, Photonics 2015, 2, pp. 1005-1026.

David A. B. Miller, Optical Interconnects, IAA Workshop, Jul. 22, 2008, pp. 1-26.

Brian Corbett et al., Chapter Three—Transfer Printing for Silicon Photonics, Semiconductors and Semimetals, vol. 99, 2018, ISSN 0080-8784, pp. 43-70, https://doi.org/10.1016/bs.semsem.2018.08.001.

Yurii Vlasov, Silicon photonics for next generation computing systems, Tutorial given at the European Conference on Optical Communications, Sep. 22, 2008.

Bing Wang et al., On-chip Optical Interconnects using InGaN Light-Emitting Diodes Integrated with Si-CMOS, In: Aais Communications and Photonics Conference 2014, Shanghai, China, Nov. 11-14, 2014, pp. 1-3.

Lei Liu et al., On-chip optical interconnect on silicon by transfer printing, In: CLEO: Science and Innovations 2018, San Jose, California, USA, May 13-18, 2018, pp. 1-2.

International Search Report on related PCT Application No. PCT/US2021/012810 from International Searching Authority (KIPO) dated May 6, 2021.

Written Opinion on related PCT Application No. PCT/US2021/012810 from International Searching Authority (KIPO) dated May 6, 2021.

International Search Report on PCT Application No. PCT/US2021/032979 from International Searching Authority (KIPO) dated Sep. 7, 2021.

Written Opinion on PCT Application No. PCT/US2021/032979 from International Searching Authority (KIPO) dated Sep. 7, 2021.

Shen, et al., "Optical cavity effects in InGaN/GaN quantum-well-heterostructure flip-chip Light-emitting diodes", Applied Physics Letters, vol. 82, No. 14, Apr. 7, 2003.

Lee, et al., Low-Cost and Robust 1-Gbit/s Plastic Optical Fiber Link Based on Light-Emitting Diode Technology, Optical Society of America, 2008.

Yahav et al., Multi-Gigabit Spatial-Division Multiplexing Transmission Over Multicore Plastic Optical Fiber, Journal of Lightwave Technology, vol. 39, No. 8, Apr. 15, 2021, pp. 2296-2304.

* cited by examiner

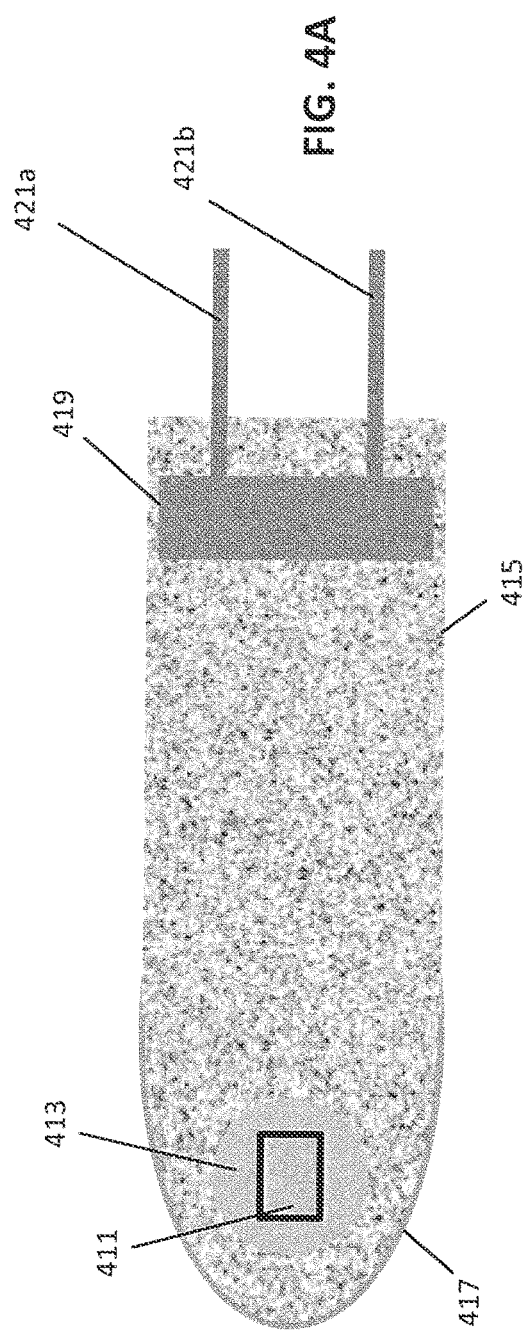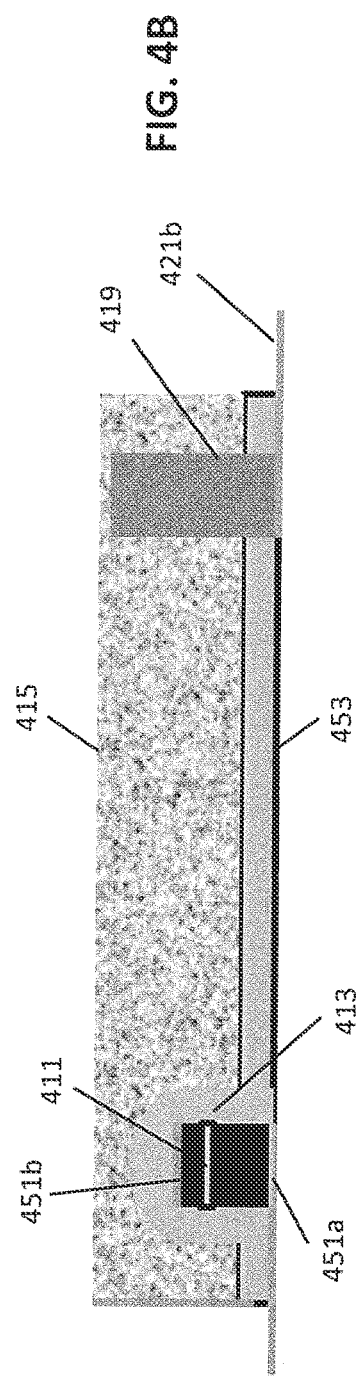

PACKAGING FOR MICROLEDS FOR CHIP TO CHIP COMMUNICATION

CROSS REFERENCE TO RELATED APPLICATIONS

This application is a continuation of U.S. patent application Ser. No. 17/145,110, filed on Jan. 8, 2021, which claims the benefit of the filing date of U.S. Provisional Patent Application No. 62/958,619, filed on Jan. 8, 2020, and 62/960,546, filed on Jan. 13, 2020, the disclosures of each of which are incorporated by reference herein.

FIELD OF THE INVENTION

The present invention relates generally to chip-to-chip optical interconnects, and more generally to chip-to-chip optical interconnects including microLEDs.

BACKGROUND OF THE INVENTION

Logic and memory capabilities may be limited by electrical interconnects. As the requirement for dataflow increases, especially in machine learning and other high-performance applications, chips may not be packaged individually, but combined into multi-chip modules. Inside these multi-chip modules, which in some cases may be considered SiPs (System in Package), multiple chips are connected using very dense wiring. For example, logic and memory may be mounted on a silicon interposer using microbumps. However, even such interposers may be insufficient to connect the desired number of ICs together at high enough data rates. The connections within these packages may be limited by the parasitic resistance, inductance, and capacitance of the wiring and the chips may need to be mounted very close to each other to reduce those effects. This could limit the number of ICs that can be combined in a multi-chip module. In addition, wiring density also poses constraints. If the number of lanes for data communication is reduced by increasing the speed per lane, then the parasitics become worse and additional power is generally consumed in the SERDES to multiplex data to higher rates.

BRIEF SUMMARY OF THE INVENTION

Some embodiments provide optical links between integrated circuits (ICs) using light from microLEDs. In some embodiments the microLEDs are packaged so as to improve light transmission characteristics.

Some embodiments provide a chip-to-chip optical interconnect including a microLED, comprising: a first semiconductor chip electrically coupled to an interposer; a second semiconductor chip electrically coupled to the interposer; the interposer including electrical signal paths electrically coupling the first semiconductor chip and the second semiconductor chip; a first microLED; first circuitry, electrically coupled to the first semiconductor chip, for driving the first microLED based on data from the first semiconductor chip; a first encapsulant substantially encapsulating the first microLED; a first photodetector; first amplification circuitry for amplifying signals from the first photodetector, the first amplification circuitry electrically coupled to provide electrical signals to the second semiconductor chip; a first waveguide optically coupling the first microLED and the first photodetector, the encapsulated first microLED within material of the first waveguide.

Some embodiments further provide a second microLED; second circuitry, electrically coupled to the second semiconductor chip, for driving the first microLED based on data from the second semiconductor chip; a second encapsulant substantially encapsulating the second microLED; a second photodetector; second amplification circuitry for amplifying signals from the second photodetector, the second amplification circuitry electrically coupled to provide electrical signals to the first semiconductor chip; the first waveguide optically coupling the second microLED and the second photodetector, the encapsulated second microLED within material of the first waveguide.

Some embodiments instead or in addition further provide a second photodetector; and second amplification circuitry for amplifying signals from the second photodetector, the second amplification circuitry electrically coupled to provide electrical signals to a third semiconductor chip; and wherein the first waveguide optically couples the first microLED and the second photodetector.

Some embodiments instead or in addition further provide a second microLED; second circuitry, electrically coupled to the first amplification circuitry, for driving the second microLED based on data from the first photodetector; and a second optical waveguide optically coupling the second microLED and a third photodetector.

These and other aspects of the invention are more fully comprehended upon review of this disclosure.

BRIEF DESCRIPTION OF THE FIGURES

FIG. 4A illustrates a top view of a structure using encapsulation and reflectors for increasing coupling of light from a microLED into a multimode waveguide, in accordance with aspects of the invention.

FIG. 4B illustrates a side cross-sectional view of the structure of FIG. 4A.

DETAILED DESCRIPTION

Some embodiments provide optical links between the integrated circuits (ICs, and microLEDs are particularly useful for this application. By using very dense arrays of optical links running at slower speed, there may be reduced or no need for serializer-deserializers (SERDES) and high data rates can be obtained with lower power consumption. There are also generally no parasitic circuit limitations or electrical crosstalk in optical links. Such optical interconnects can be realized in 2D format in waveguides or in 3D using lens arrays, holograms, or 3D waveguides. The light from microLEDs is quite different from that of lasers, in emission pattern, spectrum, and other features, and thus different packaging architectures may be preferred for use of microLEDs for chip to chip communications.

Optically-Enhanced Interposers

Figure 1:
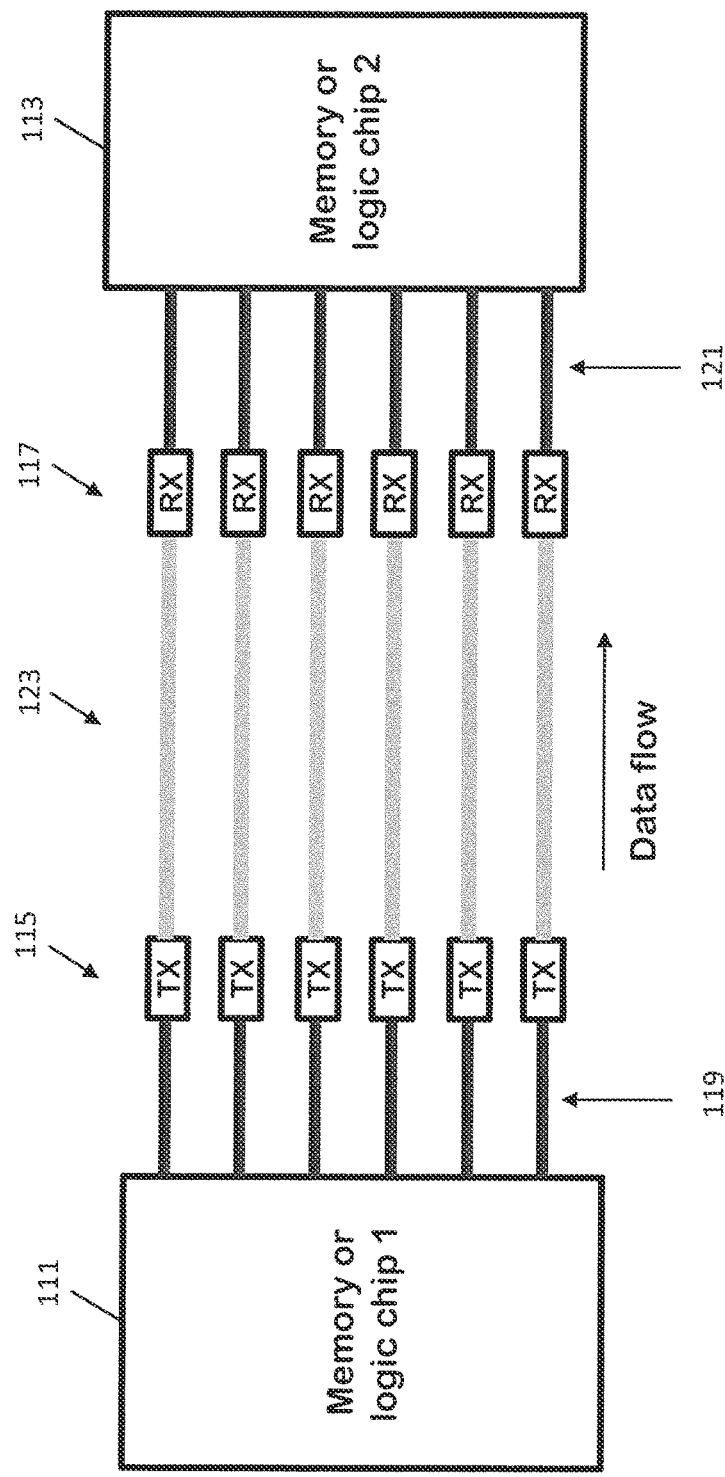
FIG. 1 shows an example of two chips in data communication, in accordance with aspects of the invention.

FIG. 1 shows two chips 111, 113 in data communication. In some embodiments the chips are microchips. In some embodiments the chips are part of a same multi-chip module. In some embodiments the chips are in a same package. In some embodiments the chips are on a same substrate, or coupled to the same substrate. The two chips are interconnected together, but instead of conventional electrical links, there are numerous transmitter (Tx) 115 and receiver (Rx) 117 blocks that convert the electrical signals to optical signals and back again. The links 119 between the Tx blocks and the microchips are electrical, as are the links 121 between the Rx blocks and the microchips. But the connections 123 between the Tx blocks and Rx blocks are optical. The Tx blocks include microLEDs for generating the optical signals based on electrical signals, and the Rx blocks include photodetectors for generating electrical signals based on received optical signals. FIG. 1 shows individual Tx and Rx blocks, but multiple Tx and Rx blocks can be integrated together on a single integrated circuit.

Figure 2:
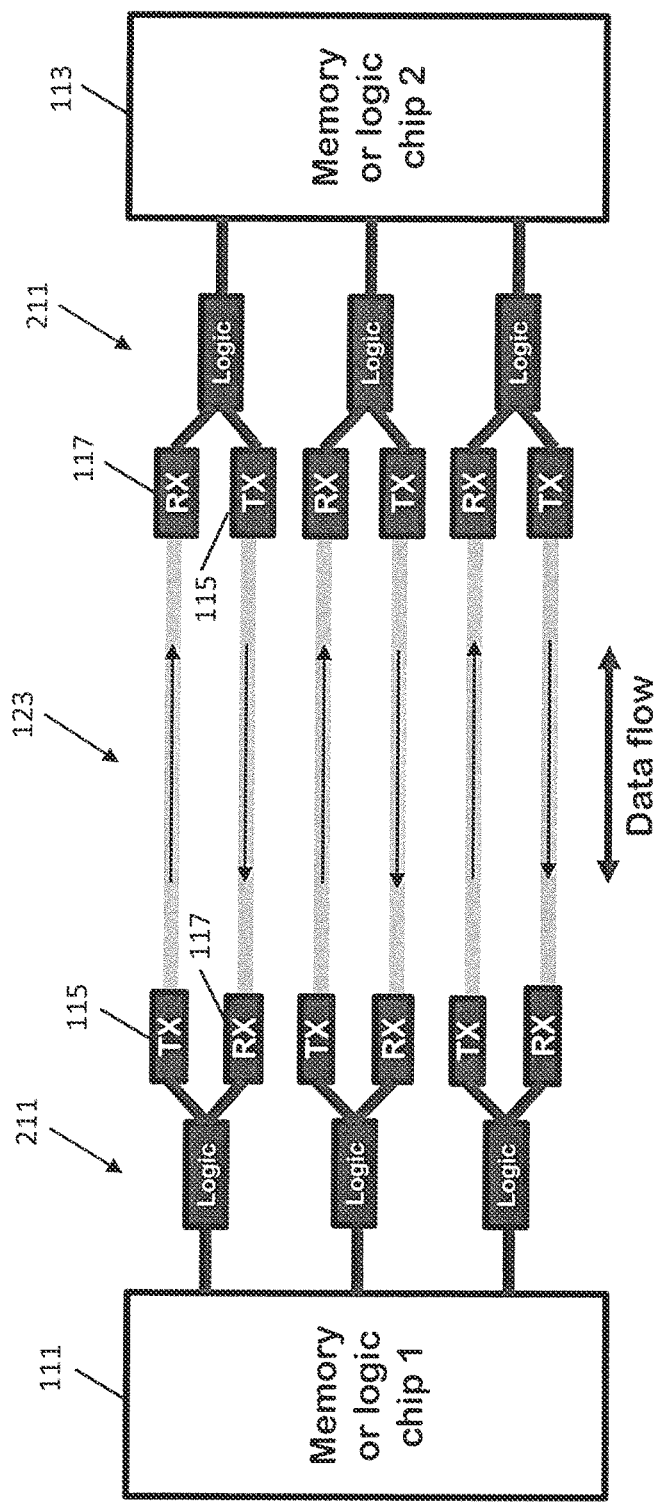
FIG. 2 shows a further example of two chips in data communication, in accordance with aspects of the invention.

Frequently microchips use the same electrical pin for both input and output, generally in half-duplex more, where either the electrical line is transmitting or it is receiving. Various handshaking routines may be used to transmit and receive using the same lines. The same can be applied in the optical domain as shown in FIG. 2. Here each electrical line is connected to a Tx block 115 and an Rx block 117. In some embodiments logic 211 connects the two together, such that when data is being sent the Tx block is activated and when it is received, the Rx block is activated. In some embodiments a separate optical line or waveguide is used for transmission and another optical line or waveguide is used for reception, as is shown in the figure. Alternatively, in some embodiments a single waveguide or optical connection is used to carry data in both directions. The latter option may provide higher density, as fewer waveguides may be used. However, there may be some loss or "blocking" associated with using the same line for transmit and receive.

Figure 3:
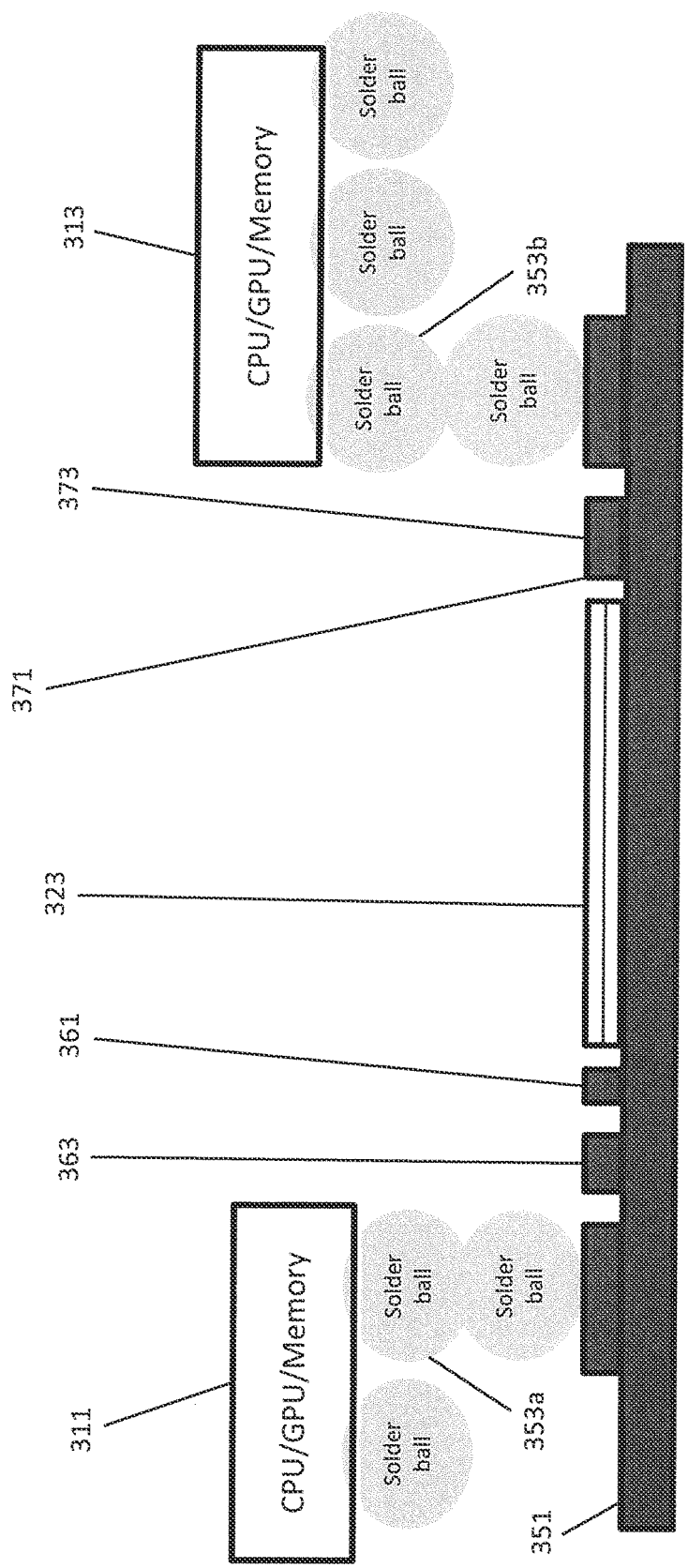
FIG. 3 shows an example basic architecture of using microLEDs for chip to chip interconnects in a 2D format, in accordance with aspects of the invention.

FIG. 3 shows the basic architecture of using microLEDs for chip to chip interconnects in a 2D format. The various chips 311, 313 to be interconnected may be microbumped onto an optical interposer assembly that is comprised of a driver 363, a microLED 361, an optical propagation medium for example in the form of a waveguide 323, photodetector 371 and an amplifier 373. In some embodiments the chips may be silicon processors. In some embodiments the chips may include a CPU, a GPU, and/or memory. The chips 311, 313 are mounted to the interposer, for example using solder balls and, in some embodiments, additional items. In FIG. 3, the chip 311 may provide data to the driver 363. The driver activates the microLED 361 so as to generate light encoding the data, with the light entering a first end of the waveguide 323 and passing through the waveguide to a second end of the waveguide. The photodetector 371 is at the second end of the waveguide and generates electrical signals based on the received light. The amplifier amplifies the electrical signals from the photodetector, with the data of the amplified signals provided to the second chip. Though the complexity is more than that of just a "wire", the link can generally operate at lower powers since the capacitance at both the source and destination chip ends is generally greatly reduced relative to an electrical connection. The interposer 351 may still have basic electrical lines such as power for the drivers and the receiver, ground line, and other control signals that are relatively slow. Mixed implementations are also possible, where some of the high-speed lines, for example some of the high speed lines between the chips 311, 313, are electrical and some are optical. There may be vias through the interposer substrate (e.g. through-chip-vias, TCVs or through-substrate-vias, TSVs) for many of the power and signal lines. There could be electrical connections from the back of the chip to the interposer through solder bumps (e.g. controlled collapse chip connection or "C4" bumps) and also from the top of the chip to the interposer through wirebonds. Thus, the optics can enhance an electrical interposer rather than completely replace all the electrical lines.

Optimizing MicroLEDs with Waveguides for Optical Interconnects

Unlike the emission from a laser that is typically confined to a relatively small number of spatial modes and is relatively directional, generally the emission from a microLED is Lambertian or omnidirectional. The light in a microLED is generated internally in the high index medium, typically a III-V semiconductor, and therefore can suffer significant total internal reflection and be difficult to extract. In fact, with no additional modifications, the total internal reflection constraint in a high index material typically limits the extraction efficiency to only a few percent. For lighting applications, the LED surface may be roughened to reduce the total internal reflection loss. The LED may also be placed on a reflective surface to make use of light sent to the rear of the device. In small devices, reflectors may be placed to the sides to also direct light emitted laterally to the front of the device. Since it is difficult to shape the LED into a spherical geometry, encapsulation of the LED into a spherical mold using a high index medium such as polymer or epoxy can also be very useful in increasing extraction efficiency as the total internal reflection criterion is reduced.

In the following discussion, a transmitter (TX) comprises a microLED and a microLED driver electrical circuit that drives the microLED. A receiver (RX) comprises a photodetector followed by a receiver electrical circuit, where a typical receiver circuit includes a transimpedance amplifier (TIA) followed by a limiting amplifier (LA). Such a TX and RX may also be considered as examples of the TX blocks and RX blocks of FIGS. 1 and 2.

A microLED is made from a p-n junction of a direct-bandgap semiconductor material. A microLED may be distinguished from a semiconductor laser (SL) in the following ways: (1) a microLED does not have an optical resonator structure; (2) the optical output from a microLED is almost completely spontaneous emission whereas the output from a SL is dominantly stimulated emission; (3) the optical output from a microLED is temporally and spatially incoherent whereas the output from a SL has significant temporal and spatial coherence; (4) a microLED is designed to be operated down to a zero minimum current, whereas a SL is designed to be operated above a minimum threshold current, which is typically at least 1 mA.

A microLED may be distinguished from a standard LED by (1) having an emitting region of less than 100 μm×100 μm; (2) typically having positive and negative contacts on top and bottom surfaces, whereas a standard LED typically has both positive and negative contacts on a single surface; (3) typically being used in large arrays for display and interconnect applications.

FIGS. 4A and 4B illustrate structure(s) for increasing coupling of light from a microLED 411 into a multimode waveguide 415. FIGS. 4A and 4B use an example of a polymer waveguide. In various embodiments, different waveguide materials can be used such as germanium-doped silicon dioxide waveguides, silicon nitride/oxide waveguide, or other materials. The cladding can be material of lower index, air, the oxidized surface of the silicon wafer, or even highly reflective mirrors such as anti-resonant reflective optical waveguides (ARROW). In some embodiments, top and side claddings may be of air, with a bottom polymer cladding.

In some embodiments the microLED can be encapsulated in an encapsulant 413, which may be a high index material, or formed in the waveguide itself. For example, a polymer waveguide can be formed in polymer with an opening. The microLED can be bonded into this hole. The hole can then be filled with an encapsulant, for example a silicone elastomer material. The encapsulant may increase the extraction efficiency by reducing the total internal reflection constraint.

In some embodiments reflectors are placed below and around the microLED to direct the light into the waveguide. The bottom surface 451a on which the microLED is bonded can be reflective, for example with a metal such as silver or aluminum. The top surface of the microLED can also be coated with a reflective contact 451b. Without these reflectors, light that would be emitted vertically up or down from the microLED generally may be lost. These reflectors send the light back into the structure where the photons could be scattered into the waveguide, or if absorbed to generate electron-hole pairs that could in turn be re-emitted into the desired optical mode. In either case, reflectors can help to steer light emitted in undesired directions into directions that can propagate down the waveguide and thus increase the efficiency of the coupling into the waveguide. A rear edge of the waveguide, away from a photodetector 419 about an opposing end of the waveguide, may also include a metallized mirror 417, for example a mirror with a parabolic shape. The photodetector may have electrical connections 421a,b.

Figure 5B:
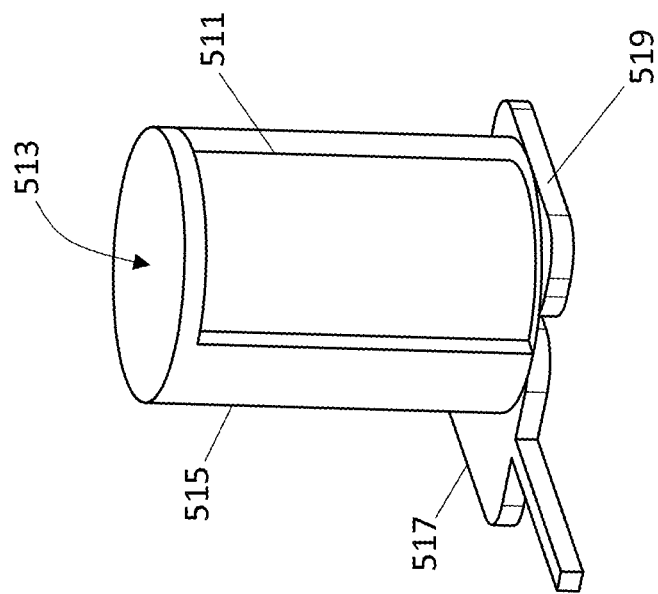
FIG. 5B is a 3D illustration of a microLED pillar showing a rear reflector wrapped around the sides, deflecting the light in a forward direction, in accordance with aspects of the invention.
Figure 5A:
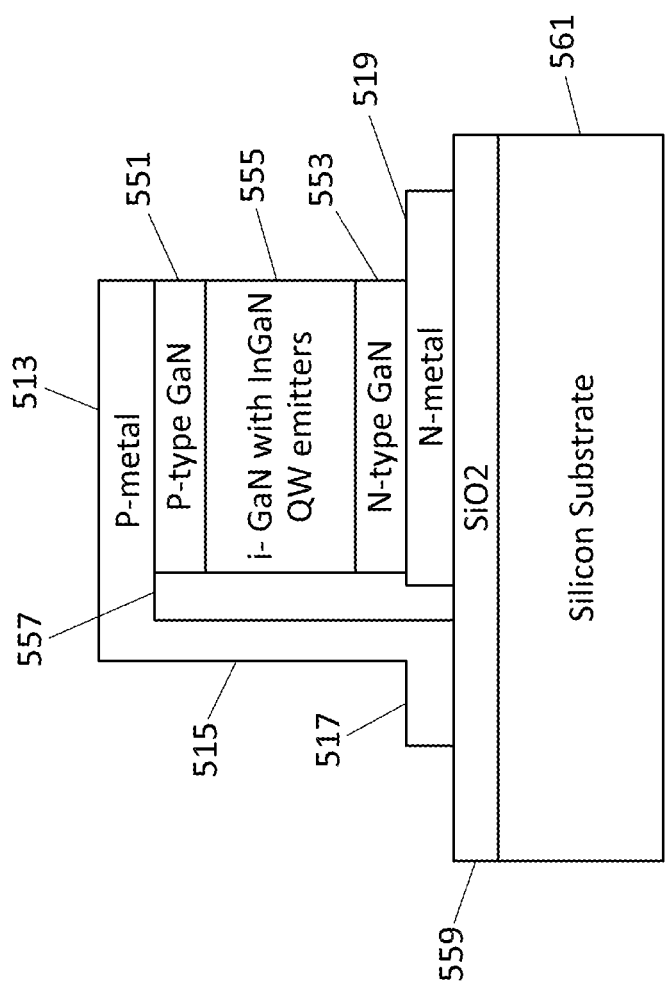
FIG. 5A shows a microLED pillar mounted on a silicon substrate with metallization above, below, and to the sides, in accordance with aspects of the invention.

Metallization around the microLED itself can be very effective. FIG. 5A shows a microLED pillar 511 (indicated in FIG. 5B) mounted on a silicon substrate 561 with metallization above, below, and to the sides. The microLED includes an N-type GaN layer 553 on an n-metal contact 519, and a P-type GaN layer 551 under a p-metal contact 513. The P-type GaN layer and the N-type GaN layer sandwich an intrinsic GaN region 555 with InGaN quantum wells. The p-metal contact includes a portion 515 that extends down the microLED, to provide a portion 517 on a silicon dioxide layer 559 on which the n-metal contact also rests. The silicon dioxide layer is on a top of the silicon substrate. A passivating layer 557 around the microLED can prevent shorting between the p-metal and the n-metal. A window on the front allows the light to escape in the right direction (as viewed in FIG. 5). FIG. 5B is a 3D illustration of a device such as the device of FIG. 5A showing how the rear reflector 515 (e.g. the p-metal) can wrap around the sides, deflecting the light in the forward direction. Selective metallization on the rear of the microLED can be implemented using angled evaporation or other lithographic technique. Passivation could be AlN, SiN, SiO2, or other dielectric materials, and could be all around the pillar as well as to the rear as typical films are transparent at the wavelength of interest. An appropriate thickness (¼ wave) could also be used as an anti-reflection coating further enhancing optical extraction efficiency.

In some embodiments the back of the waveguide is coated with a reflective layer. Ideally, the back surface can form an approximately parabolic mirror, with the microLED at the focal point and a reflective coating 417 placed to the rear of the waveguide as shown in FIG. 4A. These reflectors redirect the light going backwards into the desired forward direction.

The photodetector on the other end of the waveguide can be butt-coupled to the waveguide with the detecting area covering the waveguide cross-section. Alternatively it could be placed under the waveguide or on the sides, as all the beams impinge on the sides as well as the rear of the waveguide. This is further explained in subsequent figures.

Figure 6:
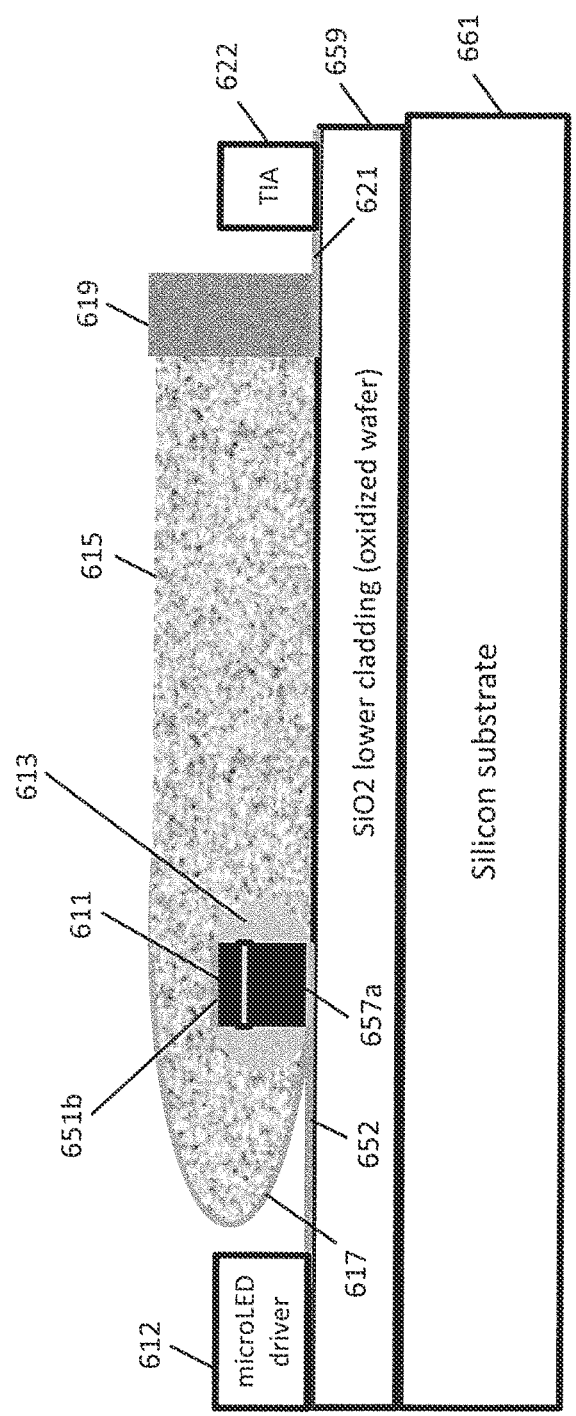
FIG. 6 illustrates a side view of a structure using encapsulation and reflectors with a spherical reflective geometry in a vertical direction for increasing coupling of light from a microLED into a multimode waveguide, in accordance with aspects of the invention.

Note that the curvature and reflective geometry in FIG. 4A can also be applied in the vertical direction with appropriate shaping of the waveguide. In some embodiments an approximately parabolic reflector is formed in the waveguide top and even bottom surface as well as the sides. The encapsulant can also be shaped optimally for maximum extraction efficiency. Ideally, the microLED is spherical in shape, but barring that, encapsulants or properly shaped reflector(s) and waveguides can optimize coupling into waveguide modes. FIG. 6 shows how a spherical reflective geometry could be used in a vertical direction. In FIG. 6, a microLED 611 is encapsulated by an encapsulant 613. The microLED and encapsulant are within and near a first end of a waveguide 615, which may be a polymer waveguide. The first end of the waveguide has a spherical geometry in at least a vertical direction (with a length of the waveguide from the first end to the second end being in a horizontal direction), with a metallized mirror 617 formed on the first end of the waveguide. A photodetector 619 is at a second end of the waveguide, with the photodetector butt-coupled to the second end of the waveguide in FIG. 6. The waveguide is on an SiO2 layer 659, on top of a silicon substrate 661. The SiO2 layer acts as a lower cladding for the waveguide. Metal trace 652 on the SiO2 layer electrically connects the microLED to a microLED driver 612, also on the SiO2 layer. Similarly, metal trace 621 connects the photodetector to a transimpedance amplifier 622, also on the SiO2 layer.

Figure 7B:
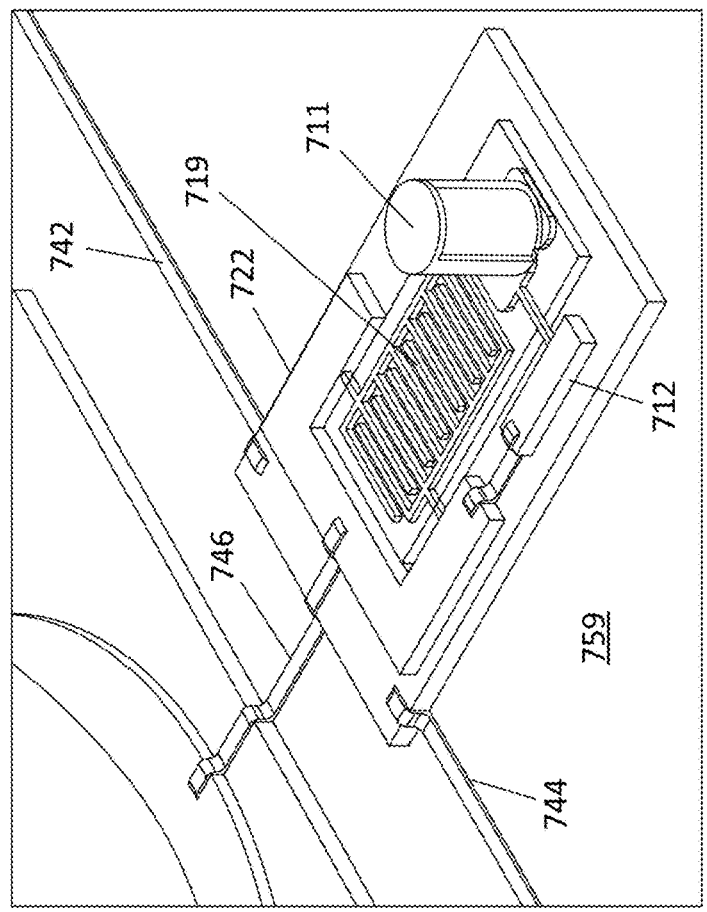
FIG. 7B is an expansion of portions of the device of FIG. 7A, with the waveguide not shown for clarity.
Figure 7A:
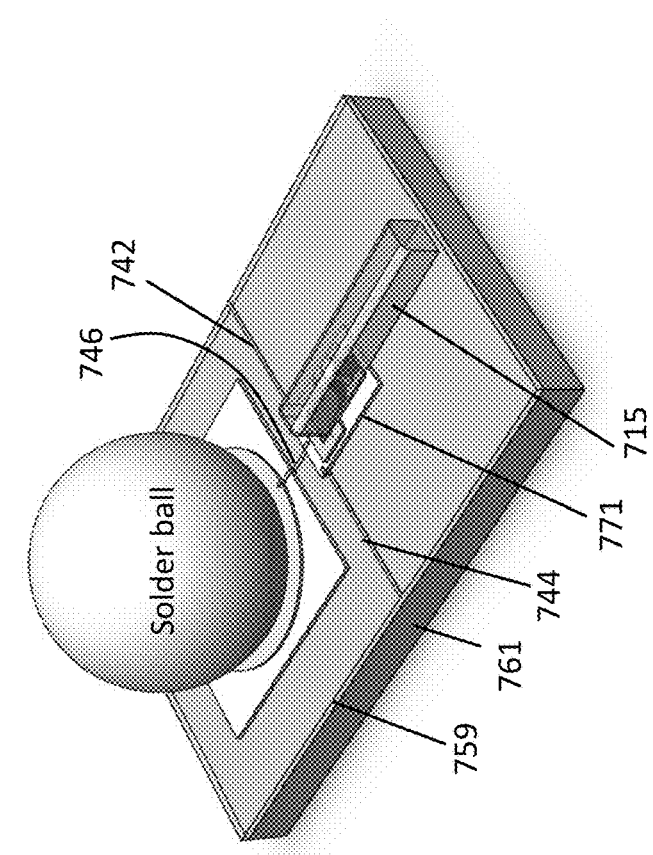
FIG. 7A shows a perspective view of a half-duplex microLED based transmitter and receiver coupled to a solder ball, in accordance with aspects of the invention.

FIG. 7A shows a 3D view of a half-duplex microLED based transmitter and receiver connected to a solder ball. In FIG. 7A, an optical waveguide 715 extends over a portion of an RX/TX chip 771 and an SiO2 layer 759 on a silicon wafer 761 on which the RX/TX chip sits. The RX/TX chip is electrically connected to the solder ball by a first electrical line 746, with the RX/TX chip also connected to a positive voltage line 742 and a ground line 744, all of which are on the SiO2 layer. In some aspects, embodiments in accordance with FIG. 7A may be considered as replacing electrical wires between solder balls (or other types of electrical connectors) in a multi-chip module with an optical waveguide and very simple driver and receiver components. The large substrate in the figure could be a silicon or glass wafer coated with a thick layer of silicon dioxide. In some embodiments the silicon dioxide may act both as a lower cladding for the waveguide and also as an electrical insulator. The solder ball, which could connect to a similar ball on a logic or memory IC, is electrically connected to the RX/TX microchip that has the RX and TX functions. This microchip could be transferred onto the substrate, or could even be made in the substrate itself. One or more lithographic steps connects this microchip to power line, ground, and a signal line to the solder ball. There could be other electrical connections to the chip, such as clock or signals for equalization or enhancement of the transmitter or receiver signals. An optical waveguide is formed on the substrate and is coupled to the microchip.

FIG. 7B is an expansion of portions of the device of FIG. 7A, with the waveguide not shown for clarity. The microchip includes 4 functional elements. There is a microLED 711 mounted on the microchip, for example as described previously with respect to FIGS. 4A and 4B, with rear and top metallization to emit the light in the forward (down the waveguide) direction. This microLED is electrically connected to a driver circuit 712 on the microchip. This driver can be a very simple transistor that changes the signal level from the source to an appropriate voltage or current to drive the microLED. It could also have other functions, such as a way to set the bias and modulation voltage, enhancement of higher frequencies, or the ability to drive a reverse bias to sweep out carriers to enhance speed. Also on the microchip is a photodetector 719 to receive the optical signal in the waveguide. There are various geometries of photodetectors, such vertical p-i-n detectors, metal Schottky diode detectors or lateral metal-semiconductor-metal detectors. In this case, FIG. 7 shows interdigitated fingers of n+ and p− regions formed in lower doped semiconductor to form a lateral p-i-n regions. The two electrical connections from the detector are biased and the photocurrent measured by a transimpedance amplifier 722 formed in the microchip. Since the detector is integrated with the transimpedance amplifier, there is very low capacitance in the connection between the two and low power and high speed performance can be obtained. Also present on the microchip is some logic, which in some embodiments could be as simple as a diode that decides whether the microchip acts as a transmitter, activating the microLED or as a receiver, taking signals from the photodetector.

In the embodiment of FIG. 7A, the waveguide is significantly larger than the microLED and the entire microLED is contained within the waveguide. As a transmitter, the microLED sends data down the waveguide. Behind the microLED is the detector on the bottom side. As a receiver, most of the light passes by the microLED, reflecting on the different surfaces of the waveguide, and is finally absorbed in the lower layer between the interdigitated fingers and generates photocurrent. There is some loss as part of the incoming light is blocked by the microLED, but if enough light is received to achieve a desired signal to noise ratio, an adequate bit-error-rate can be obtained.

There are numerous variations on this. For example, some embodiments have two separate waveguides, one for transmission and one for receiving signals. The microLED would be connected to one waveguide and the detector would be connected to the other waveguide.

The microLED could itself be used a detector with a reverse bias applied to the diode to generate photocurrent, or other photodetectors structures could be implemented.

Figure 8:
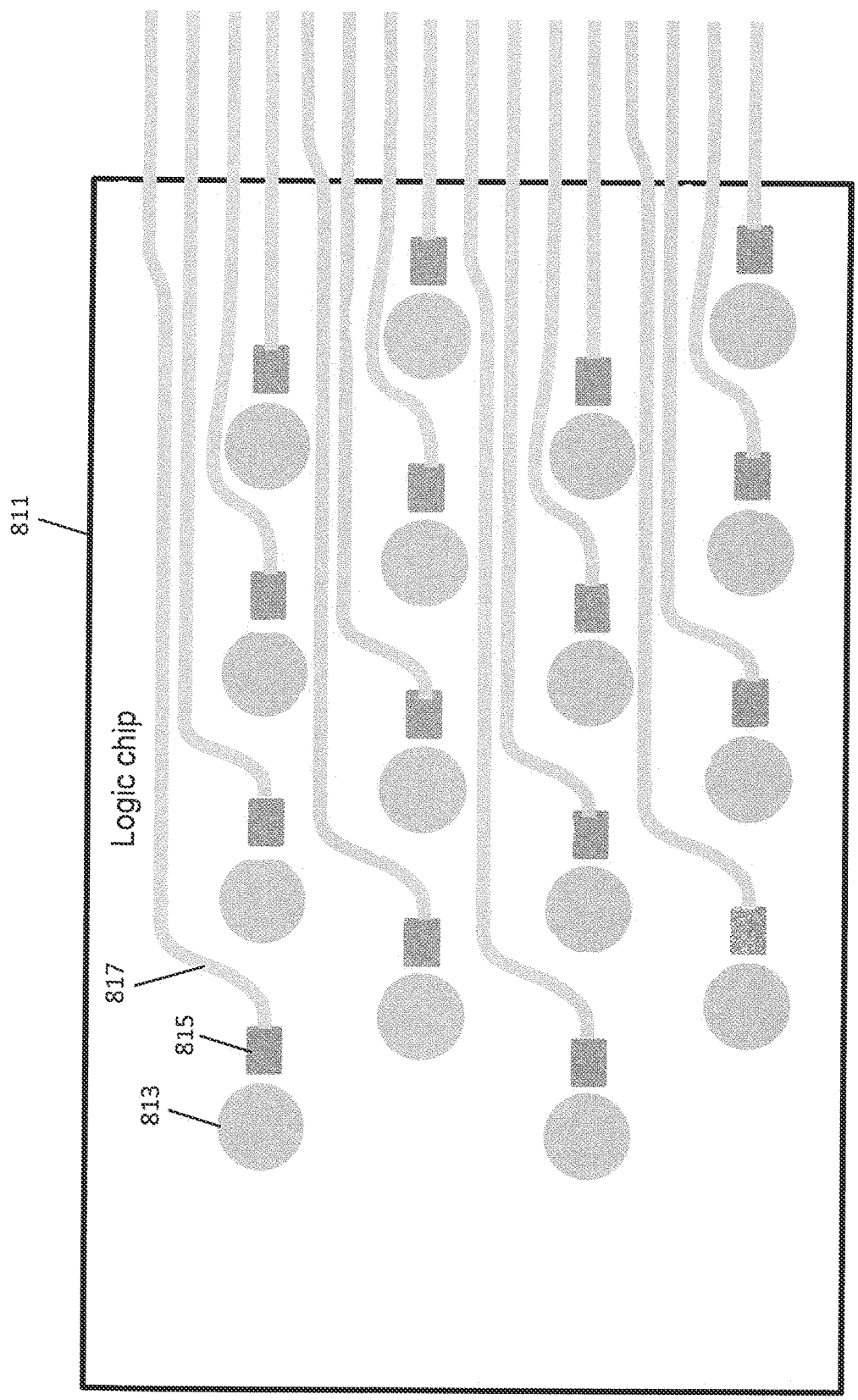
FIG. 8 illustrates a multiplicity of the optical interconnects of FIG. 7A, in accordance with aspects of the invention.

FIG. 8 illustrates a multiplicity of the optical interconnects of FIG. 7A. A logic or memory chip 811 would typically have multiple rows of microbumps or solder balls 813 underneath that connect to the silicon interposer. In this case each of the signals is routed to a Tx/Rx chip 815 and an optical waveguide 817. The waveguides from all of these bumps transport the signals from one area to another.

Diversity MicroLED-Based Optical Interconnects

Figure 9:
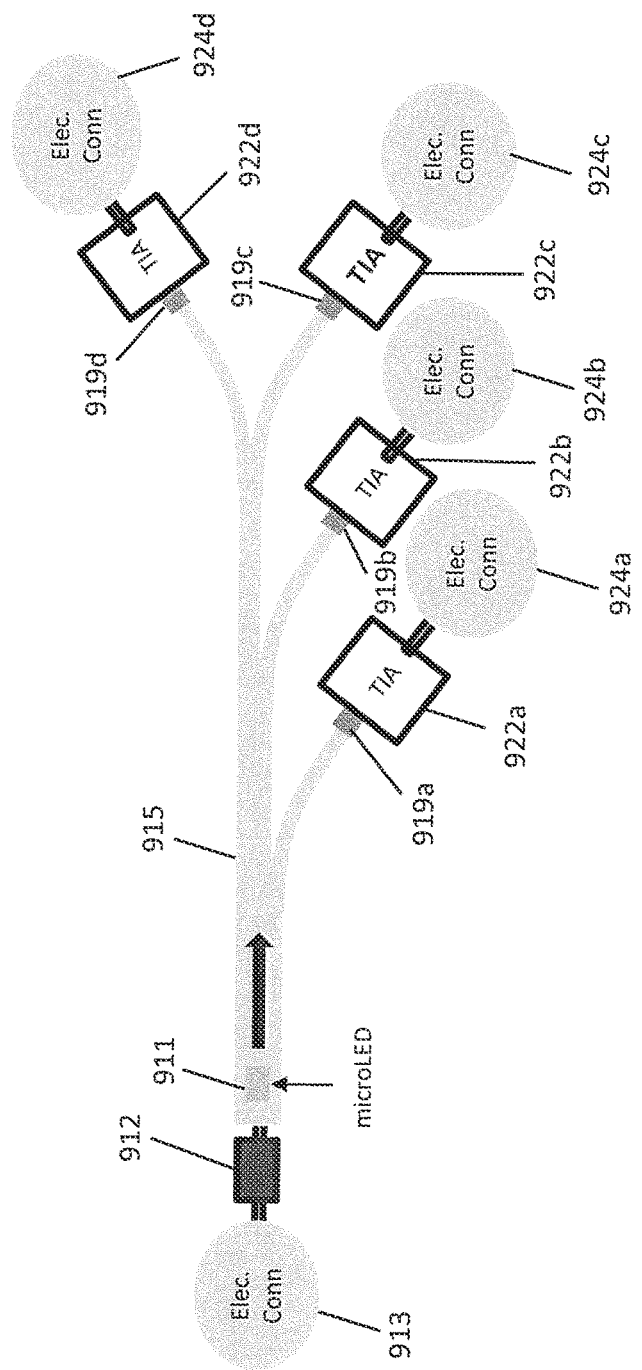
FIG. 9 shows a microLED-based TX coupled to a waveguide, with a splitter to multiple RXs, in accordance with aspects of the invention.

Once the light is in the waveguide, many optical functions may be performed optically rather than electrically, and this may have numerous advantages. For example, the function of a splitter is often difficult to do in the electrical domain, as impedance discontinuities, splitting ratios, time delays, and cross-talk to other lines can be problematic. A microLED can be coupled to a waveguide followed by an optical splitter used to connect to multiple detectors. These splitters can use star couplers or other structures. FIG. 9 shows a microLED-based TX coupled to a waveguide, with a splitter to multiple RXs. In FIG. 9 an electrical connection 913 is coupled to a microLED driver 912. The microLED driver drives a microLED 911 in a waveguide 915. A fraction of the optical power can be split off the main waveguide by an optical tap and sent to an Rx. Multiple taps/RXs can be cascaded to implement a tapped bus. In FIG. 9, a plurality of taps are shown, with each tap terminating in a photodetector 919*a-d*, coupled to a transimpedance amplifier 922*a-d*, in turn coupled to an electrical connection 924*a-d*. Alternatively, a single 1-to-N optical splitter can be used to connect one TX to multiple RXs. In some embodiments the multiple RXs are for multiple logical units, for example as may be found in AI/Machine learning/neural networking applications. In some embodiments the multiple RXs are for multiple multiplication units, for example used for matrix multiplication, in which each number may be multiplied by N other numbers and the results summed. By having the splitter in the optical domain, the same signal can be accurately sent to multiple receivers. This can also work in the analog domain, where optical signals are divided, subtracted, or in reverse, two signals can be added. Optical splitters can be very accurate and split into tens, hundreds, or thousands of waveguides, maintaining signal integrity through the splits.

Though FIG. 9 shows microLED at the end of one waveguide and detectors in other positions to implement simplex 1-to-N connectivity, the links in FIG. 9 can be operated in duplex mode (either full or half) by placing both a microLED and a detector at the end of each waveguide. Since the waveguides are generally multimode, part of the waveguide can be connected to a source and another to the receiver. For memory access and some other applications, the waveguides may be operated in half-duplex where only one source is transmitting at a given time.

Figure 10:
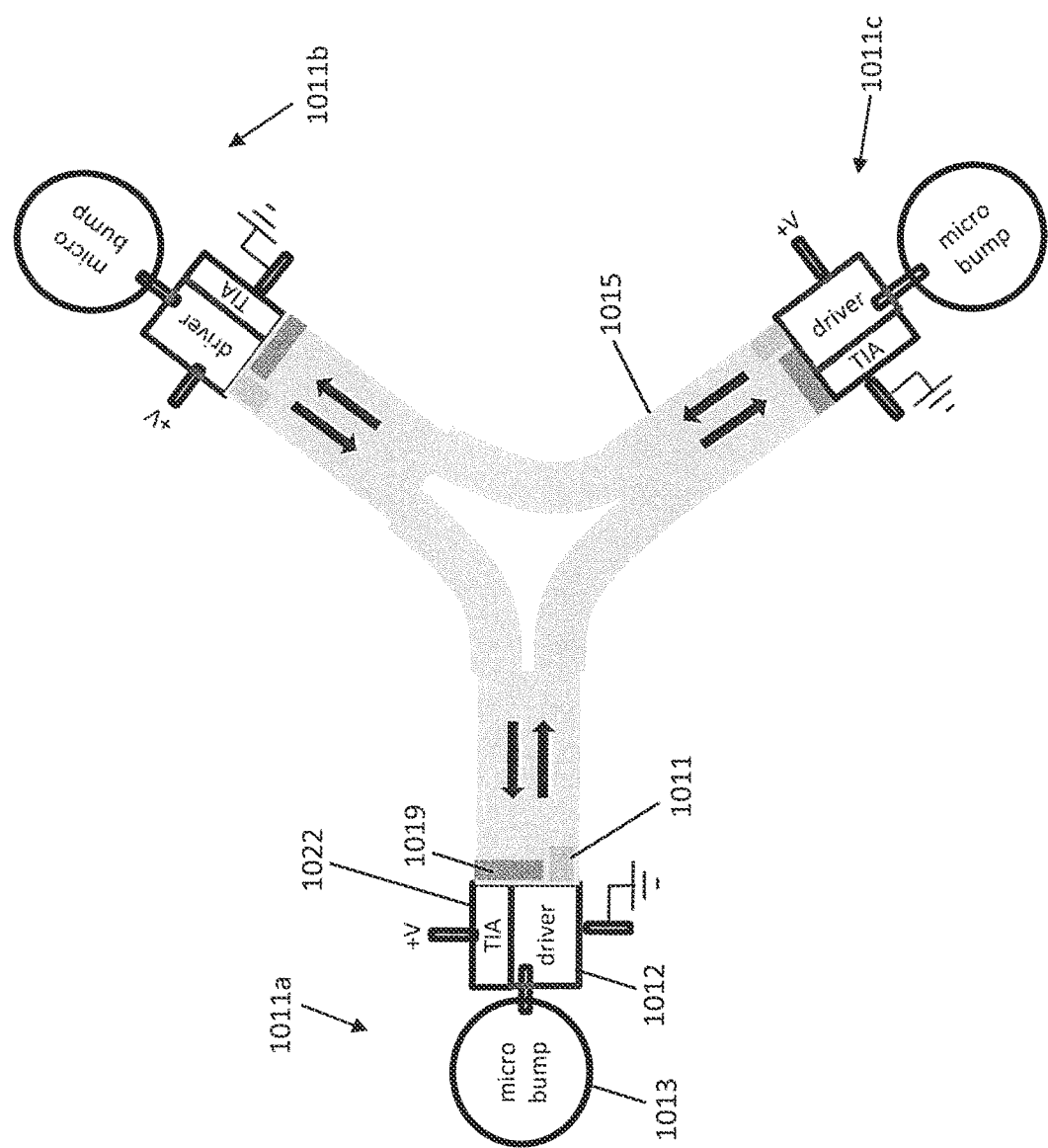
FIG. 10 shows an implementation of three nodes (each with a TX and an RX) all connected through a star topology, in accordance with aspects of the invention.

FIG. 10 shows an implementation of three nodes (each with a TX and an RX) 1011a-c all connected through waveguides 1015 in a star topology, so any node can transmit to the others and any can receive from any other. Each node is coupled to a microbump 1013, for passage of electrical signals to and from a chip. Each node includes a microLED 1011 and photodetector 1019, with a driver 1012 for driving the microLED based on signals received via the microbump and a transimpedance amplifier 1022 for amplifying signals from the photodetector. When operated in half-duplex mode, each microbump provides an input electrical signal to the TX or gets an electrical output signal from the RX, depending on whether that node is transmitting or receiving. The TIA and driver may be powered using voltages available on the interposer. In this architecture, there is some loss associated with the splitters, but a sufficiently powerful microLED can provide enough optical power to overcome the extra losses in the link and achieve a useful received signal-to-noise ratio (SNR) and/or bit-error ratio (BER). While FIG. 10 shows only three nodes, the architecture can be extended to larger numbers of nodes, constrained primarily by the ability to obtain an adequate SNR/BER at each RX.

Repeaters in MicroLED-Based Optical Interconnects

When the splitters become large, or the number of connections become too numerous, one or more repeaters of some kind may be used to maintain adequate signal amplitude and SNR. One application is the connection between logic to multiple memory modules. In a typical computer architecture, the processor data lines are shared among multiple peripherals and memory, and a chip-select line is used to turn on the various modules. This may not be preferable with closely packed memory such as High-Bandwidth Memory (HBM) because the electrical link are limited to short lengths (often <10 mm) and electrically splitting one signal to multiple modules may cause too much signal impairment.

Figure 11:
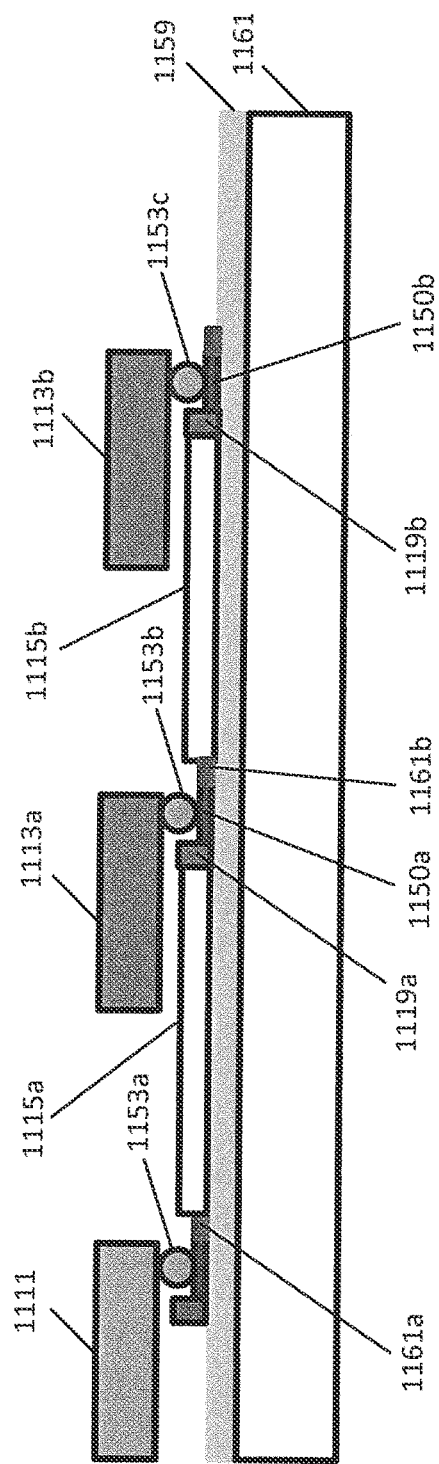
FIG. 11 shows a side view of an example microLED-based optical-to-electrical-to-optical (OEO) repeater, in accordance with aspects of the invention.

Some embodiments provide an optical approach, with a microLED based optical-to-electrical-to-optical (OEO) repeater, for example generally illustrated in FIG. 11. In FIG. 11, a logic chip 111 provides a signal by way of a solder ball 1153 to an RX/TX chip to drive an optical source 1161a. The optical source may be a microLED. The optical source is coupled to a waveguide 1115a and terminates at photodetector 1119a at a first module 1113a, an HBM stack in FIG. 11. The signal may be provided to the HBM stack by way of a solder ball 1153b. At that same termination point, the signal is regenerated by an RX/TX chip 1150a to another microLED 1161b that couples to a second waveguide 1115b and reaches a photodetector 1119b coupled to an RX/TX chip 1150b at a second HBM stack 1113. The signal may be provided to the second HBM stack by way of a solder ball 1153c. In this way multiple memory or other types of modules can be cascaded. In FIG. 11, the RX/TX chip, the microLEDs, the waveguides, and the photodetectors are shown on an SiO2 layer on top of a silicon substrate.

Figure 12:
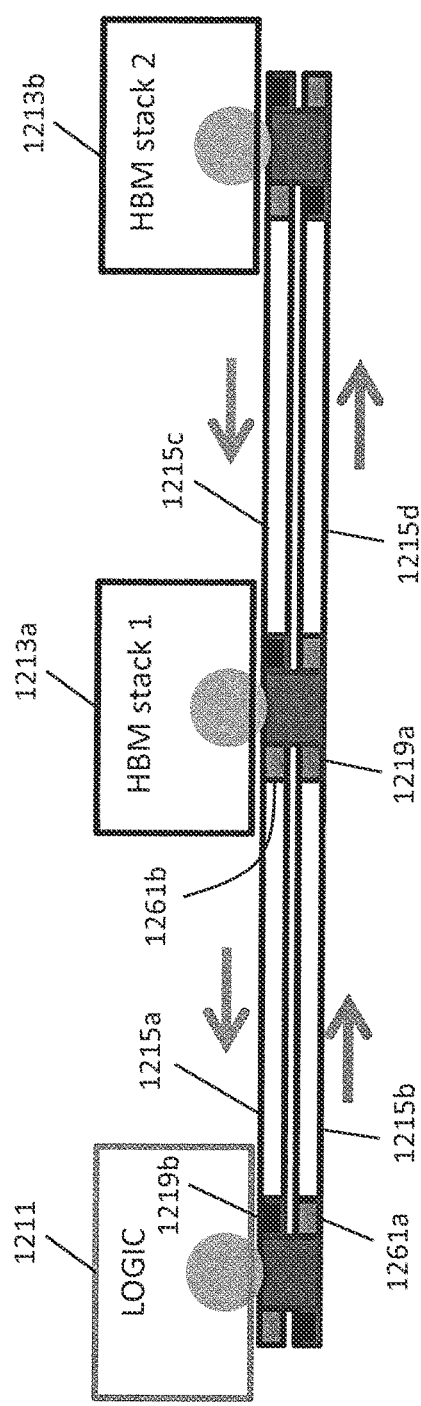
FIG. 12 shows an example top view of a bidirectional repeater-based interconnect, in accordance with aspects of the invention.

FIG. 12 shows an example top view of a bidirectional repeater-based interconnect, for example that of FIG. 11. In FIG. 12, a logic chip 1211, a first HBM stack 1213a, and a second HBM stack 1213b each have repeaters, with the repeaters for the logic chip and first HBM stack coupled by waveguides 1215a,b and the repeaters for the first HBM stack and the second HBM stack coupled by waveguides 1215c,d. For example, a microLED 1261a is provided at the logic chip end of the waveguide 1215b and a photodetector 1219a is provided at the first HBM stack end of the waveguide 1215b, while a microLED 1261b is provided at the first HBM stack end of the waveguide 1215a and a photodetector 1219b is provided at the logic chip end of the waveguide 1215a. The bidirectional interconnect uses two repeaters, where each repeater has an input waveguide optically coupled to an RX, which is electrically-connected to a microLED-based TX, which is optically coupled to an output waveguide. FIG. 12 shows the use of separate waveguides for each direction of the bidirectional link. However, the connection can also be implemented with just one waveguide used for both directions of the link.

Figure 13:
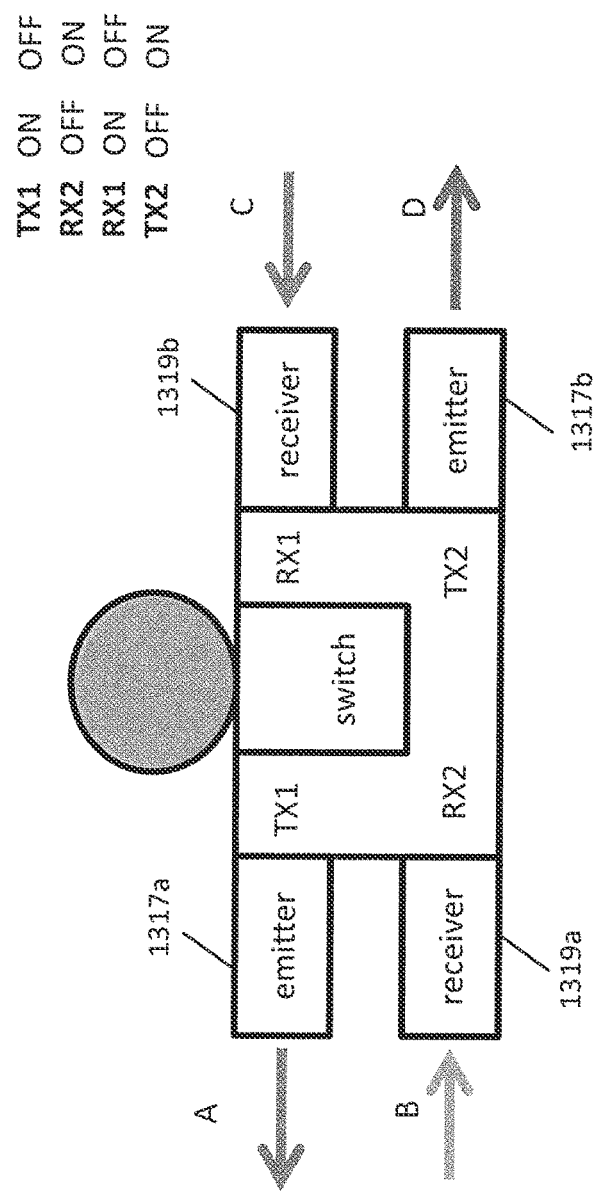
FIG. 13 shows an example of internal logic of a repeater, in accordance with aspects of the invention.

FIG. 13 shows an example of internal logic of the repeater. When data is moving from left to right, the left most receiver 1319c and TIA is active and the left most light emitter 1317a (microLED) and driver are off, and the opposite on the right most receiver 1319b and right most emitter 1317b. When the light is moving from right to left, the logic is reversed, as shown in the table. If there is some additional logic 1313 incorporated into the receiver, one could simply repeat the signal from either direction, ignore and terminate the incoming signal and generate a new signal, or simply block the signal. This becomes equivalent to a more powerful version of "tri-state" logic where a chip can get control of a bus, disengage from the bus, or even just terminate the bus.

Electronic Integration

Figure 14:
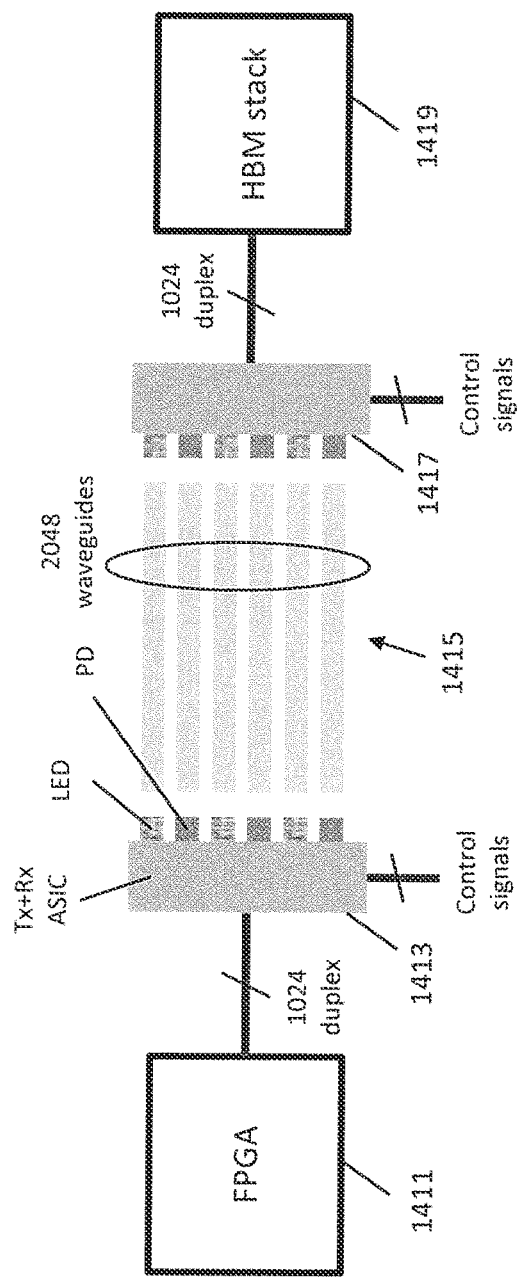
FIG. 14 shows a semi-schematic of an example implementation of an array of drivers and receivers between an FPGA and an HBM stack, in accordance with aspects of the invention.

In some embodiments drivers and receivers are monolithically integrated into an array on an IC. FIG. 14 shows a semi-schematic of an array implementation between an FPGA 1411 and an HBM stack 1419 where a single IC is used on either end. Signals to and from the FPGA are provided on a bus to a first TX/RX ASIC 1413, which drive LEDs and process signals from photodetectors. Similarly, signals to and from the HBM stack are provided on a bus to a second TX/RX ASIC 1417, which drive LEDs and process signals from photodetectors. A plurality of waveguides 1415 couple corresponding LEDs and photodetectors associated with the ASICs 1413, 1417. An advantage of an array on an IC is that timing signals can be shared along with other control signals, such as those used for bias, clock, pre-emphasis and equalization.

Figure 15:
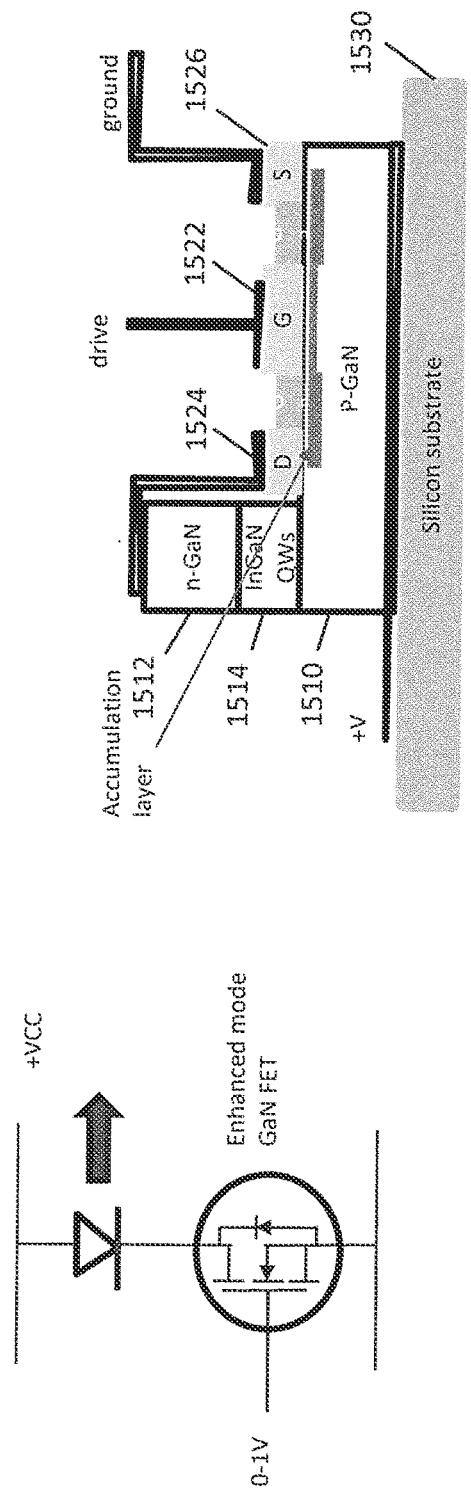
FIG. 15 illustrates an example of integrating an FET driver with a microLED, in accordance with aspects of the invention.

The driver could also be monolithically integrated with the microLED itself. As FIG. 15 illustrates a combination device of a microLED together with an enhanced-mode FET. The combination device is shown schematically on the left and a cross section on the right. A small voltage on the gate creates a connection in the accumulation region and connects the source to the drain. This drives current through the microLED and turns the microLED on.

There are numerous ways of integrating the FET with the microLED. One implementation is shown in FIG. 15. The microLED includes an n-GaN layer 1512 and a p-GaN layer 1510 sandwiching an intrinsic InGaN region including quantum wells 1514. In FIG. 15 the LED is flipped upside down, with the p-GaN layer on a silicon substrate 1530, and a 2D accumulation region is created in the p-type GaN by depositing AlGaN on the top. Some of this material is removed for a gate 1522. AlGaN has the effect of creating an n-type accumulation region below it, which are connected to the source 1526 and the drain 1524. A positive voltage on the gate makes a connection between the two accumulation regions and thereby grounds the cathode of the microLED, turning it on.

Figure 16:
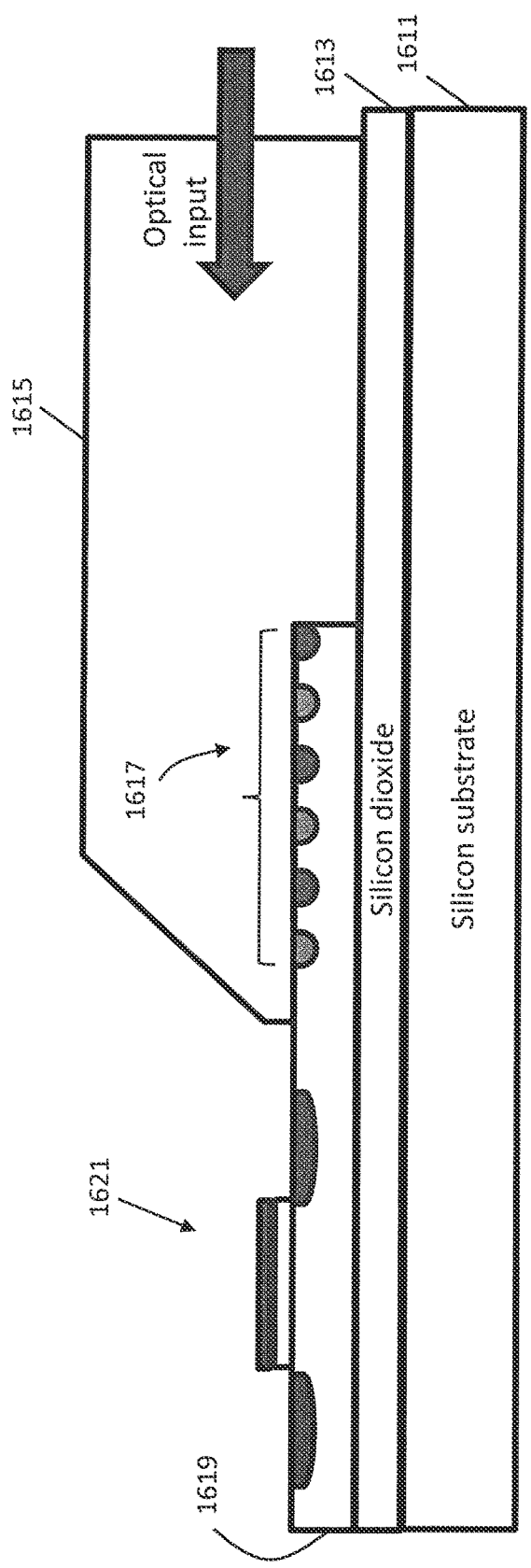
FIG. 16 shows an example of a detector integrated with an amplifier, in accordance with aspects of the invention.

FIG. 16 shows a further example of a detector integrated with an amplifier. In FIG. 16 a silicon microchiplet 1619 is on a silicon dioxide layer 1613 of a silicon substrate 1611. An optical waveguide extends over the silicon substrate and at least part of the silicon micro-chiplet, a part that will serve as a photodetector. As illustrated in FIG. 16, a lightly doped silicon layer is formed into the microchiplet 1619, with one part of the microchiplet serving as a detector 1617 and another part of the microchiplet acting as an FET 1621 that can amplify the photocurrent. There are a host of possible circuit configurations that are possible to integrate monolithically.

Although the invention has been discussed with respect to various embodiments, it should be recognized that the invention comprises the novel and non-obvious claims supported by this disclosure.

What is claimed is:

1. A chip-to-chip optical interconnect including a microLED, comprising:
    a first semiconductor chip electrically coupled to an interposer;
    a second semiconductor chip electrically coupled to the interposer;
    a third semiconductor chip electrically coupled to the interposer;
    a first microLED;
    first circuitry, electrically coupled to the first semiconductor chip, for driving the first microLED based on data from the first semiconductor chip;
    a first encapsulant substantially encapsulating the first microLED;
    a first photodetector;
    first amplification circuitry for amplifying signals from the first photodetector, the first amplification circuitry electrically coupled to provide electrical signals to the second semiconductor chip;
    a first waveguide optically coupling the first microLED and the first photodetector, the encapsulated first microLED disposed within material of the first waveguide
    a second microLED;
    a second encapsulant substantially encapsulating the second microLED;
    second circuitry electrically coupled to the second semiconductor chip, for driving the second microLED based on data from the second semiconductor chip;
    a second photodetector;
    second amplification circuitry for amplifying signals from the second photodetector, the second amplification circuitry electrically coupled to provide electrical signals to the third semiconductor chip; and
    a second waveguide optically coupling the second microLED and the second photodetector, the encapsulated second microLED disposed within material of the second waveguide.

2. The chip-to-chip optical interconnect of claim 1, wherein the first waveguide is on a surface of the interposer and the second waveguide is on the surface of the interposer.

3. The chip-to-chip optical interconnect of claim 2, wherein the first waveguide and the second waveguide each comprises a polymer waveguide.

4. The chip-to-chip optical interconnect of claim 1, wherein the encapsulated first microLED is in a hole in the first waveguide and the encapsulated second microLED is in a hole in the second waveguide.

5. The chip-to-chip optical interconnect of claim 1, wherein the first microLED includes a rear surface facing away from a path in the first waveguide towards the first photodetector, and the first microLED includes metallization on the rear surface so as to reflect light towards the first photodetector.

6. The chip-to-chip optical interconnect of claim 1, wherein the first waveguide includes a back surface, the back surface optically in a direction opposite the first photodetector with respect a position of the first microLED, the back surface including a reflector to reflect light towards the first photodetector.

7. The chip-to-chip optical interconnect of claim 1, wherein the first semiconductor chip includes a processor, the second semiconductor chip is a memory chip, and the third semiconductor chip is a memory chip.

8. The chip-to-chip optical interconnect of claim 1, wherein the first circuitry is monolithically integrated with the first microLED.

* * * * *